United States Patent [19]

Kleefstra et al.

[11] Patent Number: 4,612,521

[45] Date of Patent: Sep. 16, 1986

[54] CHARGE-COUPLED TRANSVERSAL FILTER

[75] Inventors: Marcus Kleefstra, Delft; Antonius J. M. Montagne; Jan W. Pathuis, both of Nijmegen, all of Netherlands

[73] Assignee: U.S. Philips Corporation, New York, N.Y.

[21] Appl. No.: 710,826

[22] Filed: Mar. 12, 1985

[30] Foreign Application Priority Data

Mar. 14, 1984 [NL] Netherlands ................. 8400805

[51] Int. Cl.$^4$ ............... H03H 15/02; H03K 5/153
[52] U.S. Cl. ............................. 333/165; 357/24; 333/166; 377/60
[58] Field of Search ............ 333/167, 165, 166; 364/724, 824, 825; 357/24; 377/57, 60, 63

[56] References Cited

U.S. PATENT DOCUMENTS 4,233,578  11/1980  Knauer et al. ................. 333/165
4,321,002  10/1980  Knauer et al. ................. 333/165

OTHER PUBLICATIONS

Baba et al—"A New Weighting Method For CCD Analog Samped Filter", Japanese Journal of Applied Physics, vol. 16 (1977), supplement 16-1.

Primary Examiner—Marvin L. Nussbaum
Attorney, Agent, or Firm—Robert T. Mayer; Steven R. Biren

[57] ABSTRACT

The invention relates to a charged-coupled transversal filter of the parallel-in series-out (PISO) type having a buried channel of one conductivity type and zones diffused into the channel of the other conductivity type, which zones constitute the clock electrodes. The inputs also comprise a zone of the one conductivity type which is provided in the associated zone of the second conductivity type. The weighting factors are formed by selecting the sizes of these zones, which constitute the emitters of bipolar transistors, whose bases are constituted by the clock electrodes and whose collectors are constituted by the channel. The signal to be filtered is introduced by first converting the signal into a current and by then distributing the latter over the various emitters. Stages having positive and negative weighting factors can be readily combined to form a CCD.

5 Claims, 12 Drawing Figures

CHARGE-COUPLED TRANSVERSAL FILTER

BACKGROUND OF THE INVENTION

The invention relates to a charge-coupled transversal filter comprising a charge-coupled device having a number of series-connected stages, in which there are present first means for supplying an input signal, second means by which a number of weighted signals are formed from this input signal by multiplying this input signal by weighting factors and by which the weighted signals are introduced in parallel into the said stages of the charge-coupled device, as well as third means by which the introduced signals are transported through the charge-coupled device to an output which is connected to reading means, the charge-coupled device being of the buried channel type and having a charge transport channel located at a surface of a semiconductor body and having the form of a surface layer of mainly the one conductivity type, which can be depleted throughout its thickness and is provided with a row of electrodes forming part of the said third means and comprising a group of surface zones of the second conductivity type, which are each associated with one of the said stages of the charge-coupled device, while there is provided in/on each of these surface zones a zone of the first conductivity type, which is separated from the semiconductor layer of the first conductivity type by an intermediate part of the associated surface zones of the second conductivity type.

Charge-coupled transversal filters are frequently described in the literature. Typically, a charge-coupled device (CCD) is used which is composed of MOS elements. In this device the electrodes serving for the storage and the transport of charge packets are provided in the form of conductive layers on a thin oxide layer above the charge transport channel. In a compact embodiment, the input signals are serially supplied to the input of the CCD and the weighted output signals are derived in parallel at the various stages of the CCD and are added to each other in a summation device.

A charge-coupled transversal filter of the kind described above is known inter alia from the article "A PISO JCCD Filter with High-speed Linear Charge Injection" by E. A. Wolsheimer, published in IEEE Journal of Solid State Circuits, Volume SC-18, No. 2, April 1983, p. 193/200. In this device a CCD of the buried channel type is used, the charge transport channel being formed in an n-type epitaxial layer which is grown on a p-type substrate. The electrodes are constituted by p-type surface zones which form pn junctions of the epitaxial layer. Because of these junctions this device is designated as a JCCD (Junction CCD). During operation, the junctions are biased in the reverse direction. In contrast with the conventional transversal filter described above, there are formed from each of the input signals a number of weighted signals which are supplied in parallel to the CCD, passed through the charge transport channel and added in the CCD to weighted signals already introduced. The added signals are transported through the channel to the output of the channel, at which the output signals can be derived in series. (PISO=Parallel In—Serial Out). This known device inter alia has the advantage that a bipolar technique can be used for its manufacture so that the filter can be integrated together with a bipolar circuit on a common semiconductor body. For the introduction of the weighted input signals, n-type zones can be formed in the associated p-type zones, as a result of which a bipolar transistor structure is obtained, in which the n-type zone constitutes the emitter, the p-type surface zone serving as a CCD electrode constitutes the base and the subjacent part of the n-type charge transport channel constitutes the collector. In the publication mentioned above, a method is described of introducing the weighted signals as emitter currents at the input stages of the CCD.

In this known filter, a voltage-to-current conversion is carried out for each input stage. Beside the filter coefficients or weighting factors formed outside the CCD, this method requires a fast peripheral electronic circuitry. Moreover, two JCCD lines are used, i.e. one for the positive weighting factors and a second for the negative weighting factors.

SUMMARY OF THE INVENTION

The invention has inter alia for its object to provide a charge-coupled transversal filter of the kind described in the opening paragraph, which has a simpler construction and requires a smaller amount of peripheral electronic circuitry. The invention further has for its object to provide such a charge-coupled transversal filter, in which the stages with positive and negative weighting factors are arranged in one common JCCD.

The invention is based inter alia on the recognition of the fact that it is advantageously possible to first convert the signal to be filtered into an electrical current and subsequently distribute this current over the various stages in a ratio which is determined by the weighting factors.

A charge-coupled transversal filter according to the invention is characterized in that means are provided by which the input signal is converted into an electrical current, whose value is determined by the amplitude of the input signal, in that the surface area of the zones of the first conductivity type constitute the said weighting factors and in that these zones are commonly connected to a connection to which the said current is supplied. By the use of the invention, a substantial simplification of the circuit arrangement is attained in that only one voltage-to-current conversion is required for the said number of stages and in that moreover the weighting factors need to be constructed as separate elements, but can be integrated in the CCD itself.

A preferred embodiment, which has the advantage of a particularly compact construction, due to the fact that only one CCD is required for the positive and the negative coefficients, is characterized in that the row of electrodes comprise beside the said group of surface zones of the second conductivity type (designated hereinafter as the first group) a second group of surface zones of the second conductivity type, which are each also associated with one of the said stages of the charge-coupled device, in that there is formed in/on each of these surface zones a zone of the first conductivity type, which is separated from the semiconductor layer of the first conductivity type by an intermediate part of the associated surface zone of the second conductivity type, the surface area of each of these zones of the first conductivity type constituting one of the said weighting factors and these zones also being connected to a common connection (designated as the second connection) and in that means are provided by which a current is supplied to this second connection, whose value is inversely dependent upon the amplitude of the input signal.

BRIEF DESCRIPTION OF THE DRAWING

The invention will now be described more fully with reference to an embodiment and the accompanying diagrammatic drawing, in which.

DESCRIPTION OF THE PREFERRED EMBODIMENTS

Figure 1:
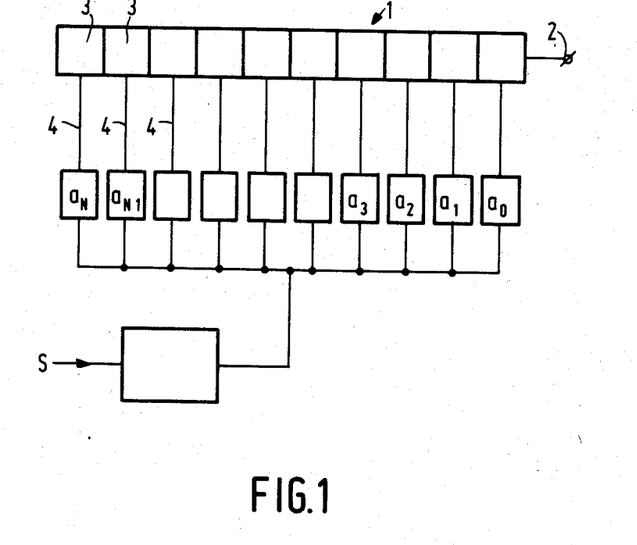
FIG. 1 shows a circuit diagram of a charge-coupled transversal filter according to the invention.

FIG. 1 shows the principle circuit diagram of a charge-coupled transversal filter of the type to which the invention relates. The arrangement comprises a charge-coupled device 1 in which the charge transport takes place in a clockwise direction and in which the input signals can be derived at the output 2. The device 1 is represented as a series of stages 3 between which the charge transport takes place. The stages 3 are provided with parallel inputs 4, via which input signals can be supplied in parallel. These input signals are derived from the signal S to be filtered by multiplying the signal S by the weighting factors $a_0, a_1, a_2$, etc. For the output signal $V_{out}$ at the instant t, it will consequently hold that:

$$V_{out}(t) = \sum_{n=0}^{N} a_n S(t - nT),$$

where T represents the delay per stage. The coefficients $a_0 \ldots a_N$ can be calculated from the desired filter characteristic.

Figure 2:
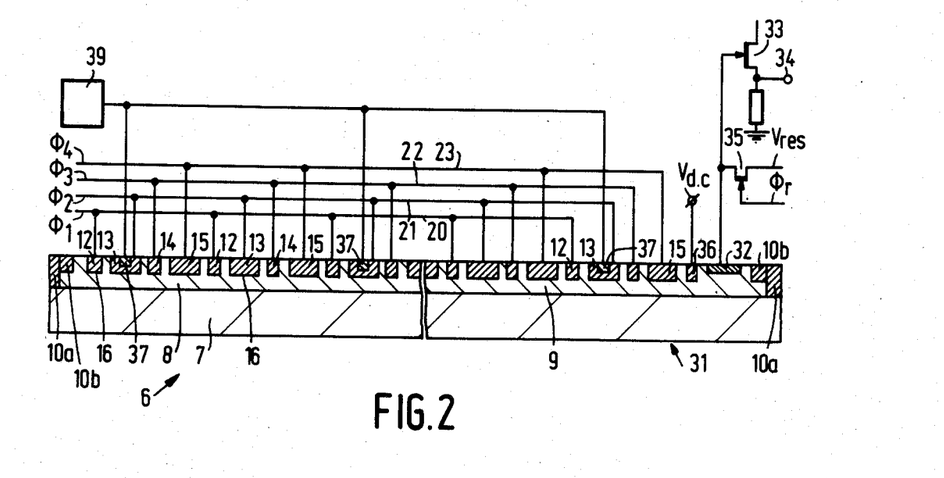
FIG. 2 is a longitudinal sectional view of an embodiment of this filter.
Figure 3:
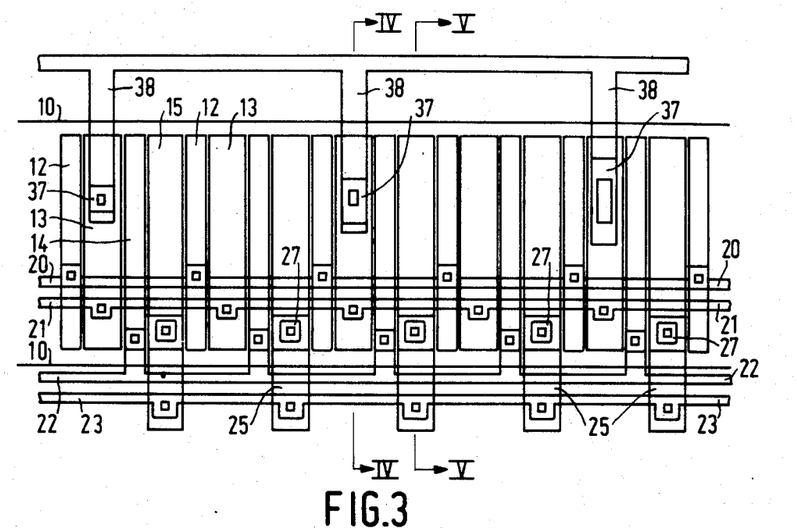
FIG. 3 is a plan view of the embodiment shown in FIG. 2.
Figure 4:
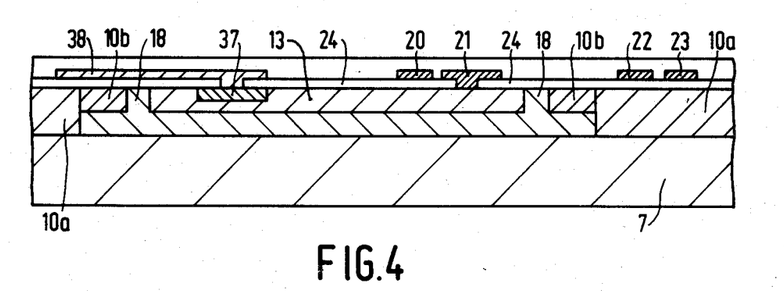
FIGS. 4 and 5 are cross-sections of the embodiment shown in FIG. 2.
Figure 5:
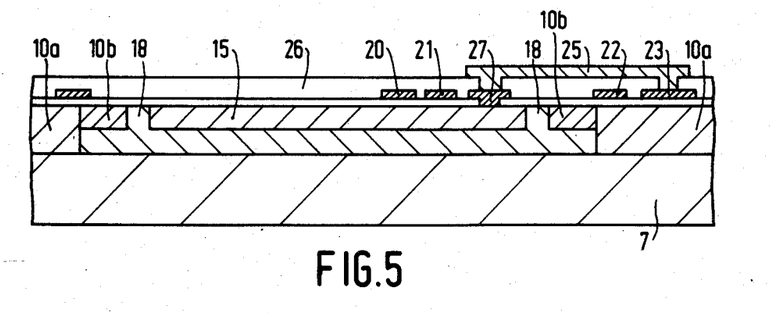

FIG. 2 shows a circuit diagram of such a parallel-in series-out transversal filter according to the invention. the charge-coupled device shown diagrammatically in sectional view in this drawing is of the JCCD type, which is described in the aforementioned publication. A diagrammatic plan view of a part of this charge-coupled device, with a few sectional views in a direction transverse to the charge transport direction, is shown in FIGS. 3–5. The device is provided in a semiconductor body 6, for which a construction can be chosen which is usual for conventional bipolar integrated cicuits having a substrate 7 of p-type silicon and an epitaxial layer 8 of n-type silicon grown on it. The buried channel of the JCCD is formed in an island-shaped part 9 of the layer 8, which is laterally bounded by the island insulation 10. In the present embodiment, the island insulation is constituted by a p-type zone which extends from the surface of the semiconductor body to the substrate 7 through the epitaxial layer 8. Of course the invention is not limited thereto. It will be appreciated that other known island insulation techniques may also be advantageously used, in which the p-type zone 10 is replaced, for example, by a pattern of silicon oxide or by grooves. Instead of MOS electrodes, which are generally used for applying clock voltages, the electrodes are constituted by p-type regions 12, 13, 14 and 15, which are separated by pn junctions 16 from the n-type channel 9. As appears from the plan view of FIG. 3 and the cross-sections of FIGS. 4 and 5, the zones 12–15 extend substantially throughout the width of channel 9. In the case in which the island insulation consists of dielectric material (for example $SiO_2$) or grooves, the zones 12–15 can extend throughout the width of the channel (island) 10. In the present case, however, in which the island insulation consists of a p-type zone, there is left between the zone 10 and the electrodes 12–15 a space 18 which should be at least so large that at the voltages applied punch-through is avoided. For the space 18 a size of about 4 $\mu$m is chosen in this case. In order to obtain an accurate definition of the space 18, the insulation zone 10 is composed of two parts, i.e. 10a and 10b. The part 10a, the so-called deep part, extends from the surface of the semiconductor body to the substrate 7. This zone is generally formed already at an early stage in the manufacture, for example immediately after the epitaxial layer 8 is grown. The zone 10b overlaps the zone 10a and projects at least along the edge of the island 9 partly beyond the edge of the zone 10a. The zone 10b, which defines together with the electrodes 12–15 the space 18, is formed simultaneously with the electrodes 12–15 and is defined together with the electrodes 12–15 in the same mask. For the space 18, smaller tolerances can thus be taken into account than if the island insulation 10 should consist only of the deep zone 10a, as is usual in conventional islands.

The charge-coupled device is operated as a 4-phase device, which is a quasi 2-phase device. The electrodes 12 and 14 act as transfer electrodes and are comparatively narrow (for example about 10 $\mu$m). The electrodes 13 and 15 act as storage electrodes and have a width of about 20 $\mu$m. The electrodes are connected in the usual manner to clock lines 20–23 for applying the voltages $\phi_1, \phi_2, \phi_3$ and $\phi_4$. The clock lines 21, 22 and 23 are constituted by strips manufactured from a first wiring layer of, for example, Al and connected, as appears from FIGS. 3–5, directly through openings in the oxide layer 24 covering the surface to the zones (electrodes) 12–14. The clock line 23 also comprises an Al strip, which is manufactured from the first wiring layer and is connected via a crossing connection to the electrodes (zones) 15. This crossing connection comprises a strip 25 in a second wiring layer of, for example, Al, which is separated from the lower wiring layer by an insulating layer 26. Through contact holes provided in the layer 26, the layer 25 is connected on the one hand to the clock line 23 and to the zone 15. As appears from FIG. 5, for the contact between the layer 25 and the electrodes 15, an Al spot 27 is provided, which is formed in the lower wiring layer and offers a few advantages with regard to the manufacturing technique, but is of course not essential.

The output stage 31 may be of conventional kind and can comprise an n-type zone 32, on which the charge can be stored to be read. The zone 32 can be connected for this purpose to the input of, for example, a source follower amplifier 33, which is provided with an output terminal 34, at which the output signals can be derived. The zone 32 is additionally connected to a main electrode region of a reset transistor 35, of which the other main electrode region can be applied to a suitable reference voltage $V_{ref}$. The transistor can be opened and closed by means of the clock signal $\phi_r$, which is applied to the gate (base) of the transistor 35.

The transistors 33 and 35 are shown in FIG. 5 as so-called JFET transistors, of which, if desired, the transistor 35 may be provided in the island (channel) 9 itself, but may also be located in another island formed in the semiconductor body. The transistor 33 is provided in a separate island. Moreover, it will be appreciated that also other transistor types than JFET's 33 and 35, such as bipolar transistors, may be used.

Between the last clock electrode (zone) 15 and the n-type zone 32 there is provided an additional electrode, which is constituted by a p-type zone 36 and is applied to a constant voltage Vd.c. and prevents cross-talk between the clock voltages and the output. The value of Vd.c. can be chosen in a simple manner by those skilled in the art between the high and the low level of the clock voltage which is applied to the electrodes 15.

The input stages, via which the weighted input signals are introduced in parallel, are fully integrated with the electrodes 13. For this purpose, there are formed in the p-type zones 13, which are associated with these input stages, n-type surface zones 37, which are commonly connected via a connection 38 to a current source 39, by which a signal-dependent current can be supplied. The zones 37 each constitute the emitter of a bipolar transistor structure, of which the base is constituted by the p-type zone 13 and of which the collector is constituted by the subjacent part of the channel 9. The weighting factors designated by $a_0, a_1 \ldots a_N$ in the circuit diagram of FIG. 1 are constituted in the arrangement according to the invention by the sizes of the emitter surfaces of the zones 37. In the plan view of FIG. 3, in which only three input stages are shown, by way of example the emitters are represented with a length increasing from the left to the right. Since, for obtaining the desired filtering technique, an accurate ratio of the emitter surfaces is of importance, it is advantageous that the emitters 37 have approximately the same width with different lengths.

Due to the fact that the emitters 37 are interconnected, just like the base zones 13, the emitter-base voltages in the various transistors are equal to each other, and the ratios between the currents in the various stages will be fully determined by the ratios between the emitter surfaces of the emitter zones 37. The weighting factors $a_0, a_1, a_2 \ldots$ are therefore entirely integrated in the charge-coupled device and do not require additional means outside the charge-coupled device. Moreover, one signal-to-current conversion is sufficient, which is a substantial simplification with respect to the known device described above.

Figure 6:
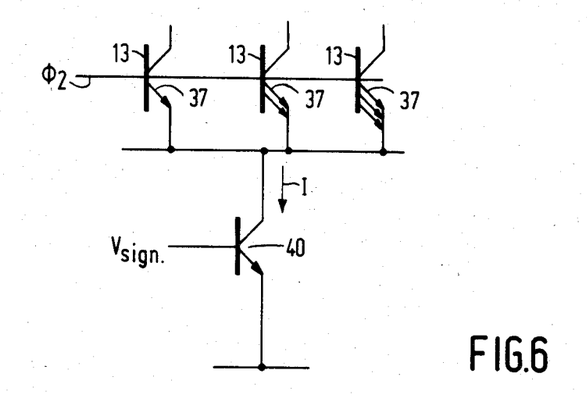
FIG. 6 shows a part of the circuitry of this filter.

FIG. 6 shows the filter from the viewpoint of the circuit technique. The p-type zones 13 and the n-type zone 37 are represented here as the base zone and the emitter zones, respectively, of three transistors, whose bases are commonly driven by the clock voltage $\phi_2$. In order to indicate the difference in size of the emitters, the lefthand transistor is shown with one emitter, the intermediate transistor with two emitters and the righthand transistor with three emitters. The means 39 supplying a signal-dependent current are merely constituted in the circuit diagram of FIG. 6 by a transistor 40, whose collector is commonly connected to the emitters 37. The input signal $V_{sign}$ to be filtered can be supplied to the base. This transistor can be integrated in the semiconductor body 1, as will be clear without further explanation.

Figure 7:
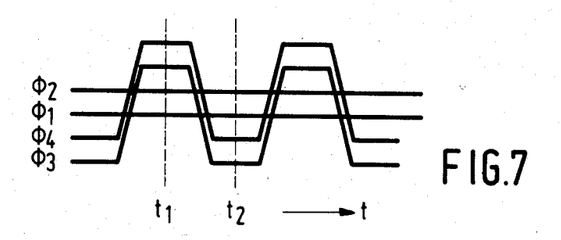
FIG. 7 shows clock voltages by which the device shown in FIG. 2 is operated.

For transferring charge from one stage to a next stage, in principle any known 4-phase clock circuit diagram can be used. However, as in the present embodiment, clock voltages are preferably used, with which a constant voltage is applied to the electrodes 13, as a result of which cross-talk of the clock voltage to the charge injection via the transistors 13,37 is avoided as far as possible. In FIG. 7, the clock voltages are shown as a function of the time t.

Figure 8:
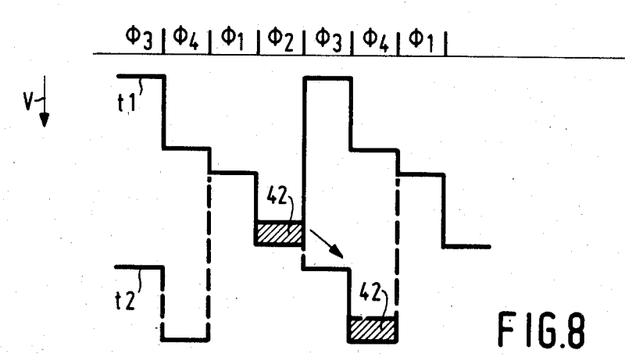
FIG. 8 shows the potential distributions in the transport channel occurring at these clock voltages.

The arrangement is operated as a 4-phase arrangement, which is a quasi 2-phase arrangement, the electrodes (zones) 12 and 14 acting as transfer electrodes and the zones 13 and 15 acting as storage electrodes. The electrodes 12 and 13 are located at a fixed level, which levels for the sake of simplicity are indicated in the drawing by $\phi_2$ and $\phi_1$, $\phi_1$ being chosen slightly lower with respect to a reference level $V_0$ than $\phi_2$ in order to obtain a potential barrier under the electrodes 12. The clock voltages $\phi_3$ and $\phi_4$ are in phase, $\phi_3$ being slightly lower again than $\phi_4$ with respect to the reference level $V_0$. The voltage levels of $\phi_1$ and $\phi_2$ are located about halfway between the high and low levels of $\phi_3$ and $\phi_4$, respectively. FIG. 8 shows the potential variation in the channel 9 under a number of electrodes 12–15 at two instants $t_1$ and $t_2$. The potential is plotted in this drawing in downward direction.

At $t_2$, $\phi_3$ and $\phi_4$ are at the low voltage level, as a result of which potential barriers are present under the associated electrodes and potential wells are present under the other electrodes. Under the electrode 13 designated in FIG. 8 by $\phi_2$, a charge packet 42 is present, which can consist of charge passed from preceding stages under these electrodes and of charge supplied in dependence upon the instantaneous input signal at $t_1$ and the weighting factor $a_i$ associated with this stage. At $t_2$, $\phi_3$ and $\phi_4$ are at the high voltage level, that is to say at a voltage higher than $\phi_3$ and $\phi_4$. Under the electrodes 15 associated with $\phi_3$ potential wells are now formed, while the potential under the electrodes 13, apart from a potential variation due to charge transport, has not changed. The charge 42 flows to the potential well under the electrodes 15 ($\phi_3$). At the same time, depending upon the instantaneous input signal, fresh charge can be supplied to the packet. This supply is not terminated until in a next step the charge 42 is transported further in a potential well under the next electrode 13 when $\phi_3$ and $\phi_4$ return to the low voltage level.

In this mode of operation, cross-talk of clock voltages at the input stage of the filter and hence also distortion of the input signal are substantially completely prevented. Moreover, it is possible to use 100% of a clock cycle for sampling.

In the embodiment described here, the weighting factors $a_1, a_2 \ldots a_N$ all have the same sign (+ or −). The invention can also be applied in the transversal filters having both positive and negative weighting factors. Use may then advantageously be made of two charge-coupled devices having the configuration described above, one of which constitutes a summation device for the positive weighting factors and the other constitutes a summation device for the negative weighting factors, while for example, the outputs are connected to the inputs of a differential amplifier, whose output supplies the ultimate filtered output signal.

Figure 9:
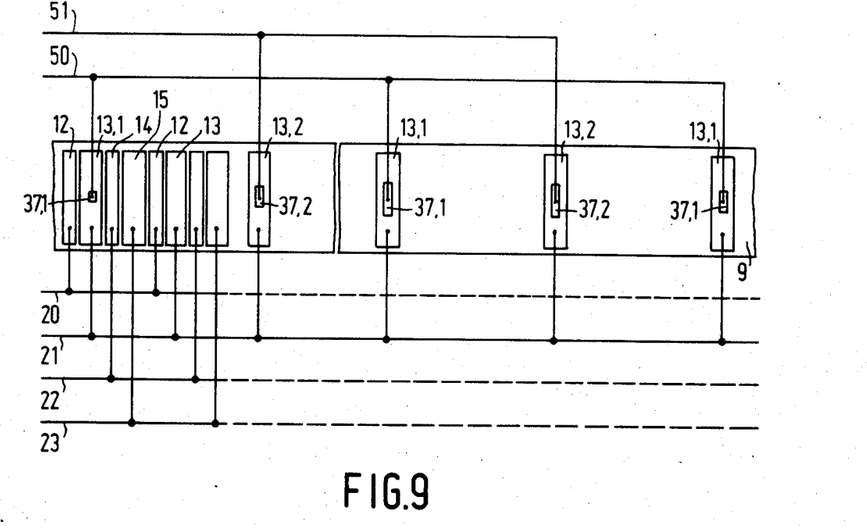
FIG. 9 is a plan view of a second embodiment of a filter according to the invention.

In the following embodiment, a transversal filter having positive and negative weighting factors, in which only one charge-coupled device is present, will be described. FIG. 9 shows a diagrammatic plan view of a part of such a filter. In these Figures, for the sake of simplicity, the same reference numerals are used as in FIG. 3 for corresponding parts. The device again comprises a (buried) channel in the form of an n-type island 9, in which p-type surface zones 12–15 are provided as clock electrodes. For the sake of clarity, only a few of the electrodes 12,14 and 15 and of the electrodes 13 not used as input are shown. Most of these electrodes are omitted in the drawing, but should be assumed to lie between the electrodes 13,1 and 13,2 which are shown. The electrodes are connected to the clock lines 20–23, also shown diagrammatically, to which the clock voltages $\phi_1, \phi_2 \phi_3$ and $\phi_4$ shown in FIG. 7 can be applied. The electrodes 13, which are used as inputs, are distinguished in FIG. 9 in two groups which are designated by 13,1 and 13,2, respectively. The electrodes 13,1 are provided with emitters 37,1, which are connected to a common supply conductor 50. The electrodes 13,2 are provided with emitters 37,2, which are connected to the common supply regions 51. The sizes of the emitters 37,1 amd 37,2, again constitute the weighting factors, while the emitters 37,1 represent the positive weighting factors and the emitters 37,2 represent the negative weighting factors. In FIG. 9, three stages with positive weighting factors and two stages with negative weighting factors are shown, but it will be appreciated that these numbers may also be different. Moreover, in FIG. 9 the weighting factors are alternately positive and negative, but this is of course not necessary.

Figure 10:
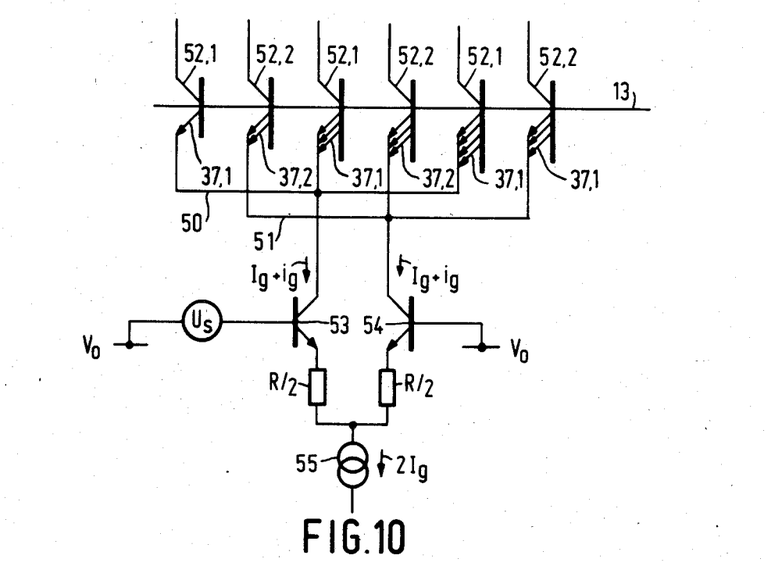
FIG. 10 shows the circuitry of the device shown in FIG. 9.

FIG. 10 shows a circuit diagram corresponding to that of FIG. 6 for a transversal filter having positive and negative weighting coefficients. The value of the weighting factors is indicated again by the number of emitters 37 of the transistors 52,1 and 52,5. For supplying the currents, the common emitter connection 50 of the emitters 37,1 is connected to the collector of the transistor 53. In the same manner, the common emitter connection 51 of the emitters 37,2 is connected to the collector of the transistor 54. The transistors 53 and 54, which have the same dimensions, are commonly connected on the emitter side via equal resistors R/2 to a current source 55. The base of the transistor 54 is connected to a suitably chosen reference voltage $V_o$. The base of the transistor 54 is also connected to $V_o$ via the signal source 56.

During operation, when the input signal Us=0, a current $i_g$ will flow through each of the two branches. When Us is unequal to zero and is positive, the transistor 53 will draw a slightly larger current, depending upon the value of Us, while the current flowing through the transistor 54 will be proportionally smaller. The current $I_g + i_g$ then flows through the branch comprising the transistor 53, where $i_g$ represents the signal current and $I_g$ represents a d.c. level, while a current $I_g - i_g$ will flow through the branch comprising the transistor 54.

Conversely, with a negative input signal Us, a current $I_g - i_g$ will flow through the branch comprising the transistor 53 and a current $I_g + i_g$ will flow through the branch comprising the transistor 54.

Thus, signal currents can be obtained for the transistor 52,1 and 52,2 which have mutually opposite signs, with the d.c. current $I_g$ as a reference level.

The value of $I_g$ can be chosen in a simple manner and depending upon the situation by those skilled in the art. The minimum value is generally determined by the maximum value of $i_g$. The maximum value of $I_g$ will generally be determined by the charge stage capacity in the CCD channel. The resistors R/2 included in the circuit diagram of FIG. 10 to obtain a linear relation $U_s - i_g$ should be much larger than the internal impedance of the base-emitter junction of the transistors 53,54, that is to say $i_g$ should on approximation be equal to Us/R and that therefore R is chosen much larger than $2KT/qI_g$, where K represents the Boltzmann constant, T represents the absolute temperature, q represents the elementary quantity of charge and $I_g$ represents the d.c. adjustment level of the transistors.

In practical applications of the transversal filters described here, the maximum quantity of charge that could be transported through the CCD channel was approximately 0.25 p.C. At a clock frequency of 20 mHz, this means that the maximum injector current amounts to not more than about only 5 µA. In a transversal filter, this small current has to be distributed parallel to the values of the weighting factors over the various CCD input stages. In filters having a large number of coefficients, the overall injector capacity can be so large that the injector cut-off frequency is lower than the signal frequencies to be processed.

Figure 11:
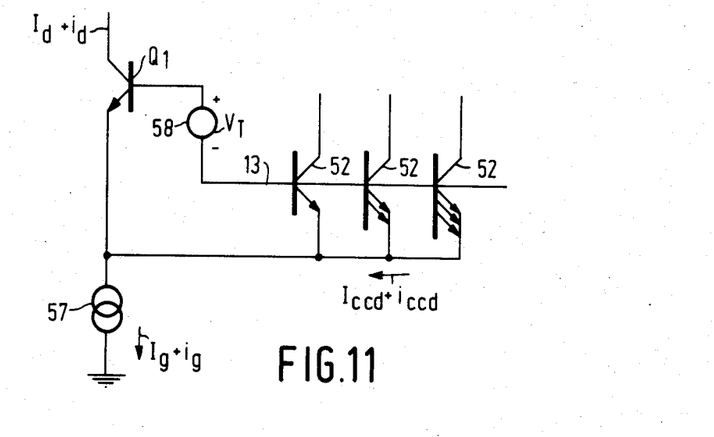
FIG. 11 shows the circuit diagram of a third embodiment of a filter according to the invention.

The frequency behavior may be improved, if required, by arranging a dump transistor parallel to the CCD injectors and by causing a comparatively large current to flow through this dump transistor. FIG. 11 shows the circuit diagram of an embodiment of a transversal filter having such a dump transistor. The input stages of the filter are again represented by transistors 52, of which the number of emitters constitute the values of the associated weighting factors. The emitters are commonly connected to the current source 57, which supplies a current $I_g + i_g$, where $I_g$ represents a d.c. level and $i_g$ represents a signal component. The bases 13 of the transistors 52 are connected via a bias voltage source 58 to the base of the dump transistor $Q_1$. The voltage source 58 supplies a voltage $V_T = jT$, where j is a suitably chosen temperature coefficient. When it assumed that the overall emitter surface area of the transistors 52 is n times larger than that of $Q_1$, it holds that:

$$I_D/I_{CCD} = (1/n) \exp. (qV_T/kT)$$

This ratio is substantially temperature-independent. Moreover, it holds that:

$$I_{CCD} + I_D = I_g$$

It follows from these two equations that:

$$\frac{I_{CCD}}{I_g} = \frac{1}{1 + \frac{1}{n} \exp \frac{qV_T}{kT}}$$

It holds for the signal components $i_{CCD}$ and $i_g$ that:

$$\frac{i_{CCD}}{i_g} = \frac{1}{1 + \frac{1}{n} \exp \frac{qV_T}{kT}} \cdot \frac{1}{1 + jf/f_{T^*}},$$

where j is the imaginary number, f is the frequency and $f_{T^*}$ is the cut-off frequency of the circuit arrangement as a whole. For $f_{T^*}$ it can be derived that it holds on approximation:

$$f_{T^*} = \frac{f_{TCCD} \cdot f_{TQ1} \cdot I_g}{I_{CCD}f_{TQ1} + I_df_{TCCD}},$$

where $f_{TCCD}$ is the cut-off frequency of the CCD and $f_{TQ1}$ is the cut-off frequency of $Q_1$. With a suitable dimensioning, an $F_{T^*}$ can be obtained which is much larger than $f_{TCCD}$. When, for example, in a particular embodiment, in which $f_{TCCD} \approx 0.5$ MHz and $I_{CCD} \approx 2$ μA, a dump transistor $Q_1$ is provided with $f_{TQ1} \approx 50$ MHz and $IQ_1 = 10$ μA, a cut-off frequency $f_{T^*}$ of about 5.2 MHz is obtained. For many applications, such a cut-off frequency is sufficient.

Figure 12:
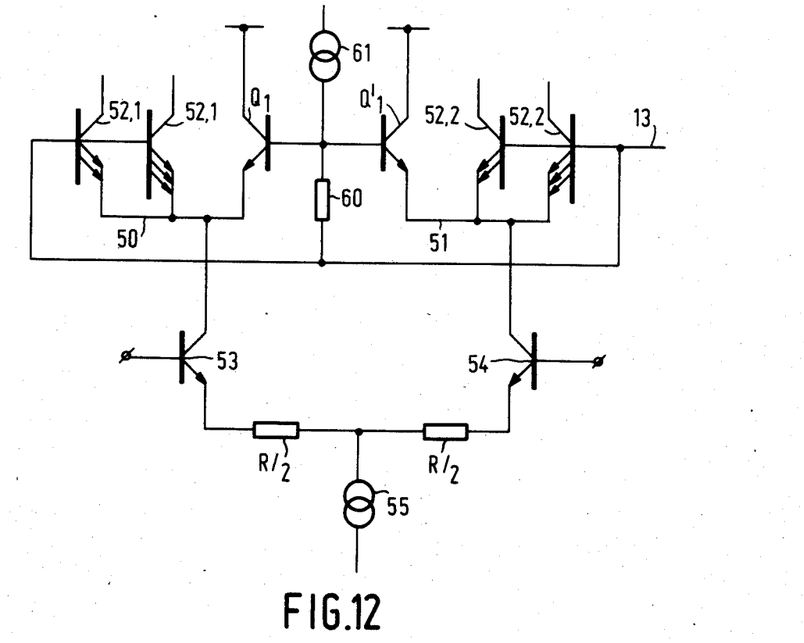
FIG. 12 shows the circuit diagram of a fourth embodiment of a filter according to the invention.

FIG. 12 shows the circuit diagram of a transversal filter having positive and negative weighting factors corresponding to the circuit diagram of FIG. 10, which is provided with such dump transistors $Q_1$ and $Q_1'$ for increasing the cut-off frequency. For corresponding parts, the same reference symbols are used in this circuit diagram as in FIG. 10. For the sake of clarity of the circuit diagram, the transistors 52,1 associated with the stages having positive weighting factors are indicated as a group in the lefthand part of the diagram, while the transistors 52,2 associated with the input stages having negative weighting factors are indicated as a group in the righthand part of the drawing. However, it will be appreciated that the distribution of the stages having positive and negative weighting factors is entirely determined by the desired filter characteristic. Instead of one dump transistor, the circuit arrangement comprises two dump transistors $Q_1$ and $Q_1'$, which are practically identical to each other. The transistor $Q_1'$ is associated with the negative coefficients. Between the bases of $Q_1$ and $Q_1'$ and the bases 13 of the transistors 52 there can be applied a bias voltage by means of the constant resistor 60 and the temperature-dependent current source 61, which supplies a current linearly varying with the temperature T, as a result of which a temperature-dependent voltage $V_T$ corresponding to the voltage $V_T$ in FIG. 11 is applied across the resistor 13. As in the embodiment shown in FIG. 10, the base of the transistor 54 can be applied to a suitably chosen reference level and the input signal fluctuating around this reference value can be applied to the base of the transistor 53.

It will be appreciated that the invention is not limited to the embodiments described herein, but that within the scope of the invention many further variations are possible for those skilled in the art.

What is claimed is:

1. A charge-coupled transversal filter comprising a charge-coupled device having a plurality of series-connected stages, each comprising first means for supplying an input signal, second means for forming a plurality of weighted signals from this input signal by multiplying this input signal by weighting factors and by which the weighted signals are introduced in parallel into said stages of the charge-coupled device, an output, and third means for transporting the introduced signals through the charge-coupled device to said output, which output is connected to reading means, the charge-coupled device being of the buried channel type and having a semiconductor body and a charge transport channel located at a surface of said semiconductor body and having the form of a surface layer mainly of a first conductivity type, which can be depleted throughout its thickness and is provided with a row of electrodes which form part of said third means and comprise a group of surface zones of the second conductivity type, which zones are each associated with one of the said stages of the charge-coupled device, a zone of the first conductivity type provided adjacent each of the surface zones which is separated from the semiconductor layer of the first conductivity type by an intermediate part of the associated surface zones of the second conductivity type, and means for converting the input signal into an electrical current, the value of which is determined by the amplitude of the input signal, the surface areas of the zones of the first conductivity type comprising said weighting factors, and these zones of the first conductivity type being commonly connected to a connection to which said current is supplied.

2. A charge-coupled transversal filter as claimed in claim 1, characterized in that the row of electrodes comprises, in addition to said group of surface zones of the second conductivity type (hereinafter first group) a second group of surface zones of the second conductivity type, which are each also associated with one of said stages of the charge-coupled device, in that there is formed adjacent each of these surface zones a zone of the first conductivity type, which is separated from the semiconductor layer of the first conductivity type by an intermediate part of the associated surface zone of the second conductivity type, the surface area of each of these zones of the first conductivity type comprising one of said weighting factors and these zones also being connected to a second common connection and in that means are provided by which a current is supplied to this second common connection whose value is inversely dependent upon the amplitude of the input signal.

3. A charge-coupled transversal filter as claimed in claim 2, characterized in that said means for converting an input signal into an electrical current comprises a current source, which supplies a signal-independent current I, and in that further means are provided by which a part $I+\Delta I$ is conducted to the first connection and a part $I-\Delta I$ is conducted to the second connection, the current part $\Delta I$ being determined by the amplitude of the input signal.

4. A charge-coupled transversal filter as claimed in claim 3, characterized in that said further means comprises two bipolar transistors, of which the emitters are commonly connected to the source, while the collectors are connected to the first and second connection respectively, and in that further switching means are provided by which a voltage difference varying linearly with the input signal is applied between the bases of the first and second transistors.

5. A charge-coupled transversal filter as claimed in claim 1 or 2, characterized in that, in order to increase the cut-off frequency, there is added to at least one of the group of input stages having positive weighting factors and the group of input stages having negative weighting factors a transistor whose emitter is connected to the associated common connection, which is also connected to the associated surface zones of the first conductivity type, while the base is connected to means for applying a voltage difference which is proportional to the absolute temperature between the base and the associated surface zones of the second conductivity type.

* * * * *